United States Patent
Fitzek et al.

(10) Patent No.: US 7,999,704 B2
(45) Date of Patent: Aug. 16, 2011

(54) LOW COMPLEXITY COMPRESSION OF SHORT MESSAGES

(75) Inventors: Frank Fitzek, Aalborg (DK); Stephan Rein, Berlin (DE); Clemens Guehmann, Berlin (DE)

(73) Assignee: Aalborg Universitet, Aalborg (DK)

( * ) Notice: Subject to any disclaimer, the term of this patent is extended or adjusted under 35 U.S.C. 154(b) by 144 days.

(21) Appl. No.: 12/293,020

(22) PCT Filed: Mar. 14, 2007

(86) PCT No.: PCT/DK2007/000127
§ 371 (c)(1),
(2), (4) Date: Feb. 11, 2009

(87) PCT Pub. No.: WO2007/104313
PCT Pub. Date: Sep. 20, 2007

(65) Prior Publication Data
US 2009/0177799 A1    Jul. 9, 2009

(30) Foreign Application Priority Data
Mar. 14, 2006   (DK) ................................. 2006 00366

(51) Int. Cl.
*H03M 7/00*   (2006.01)
(52) U.S. Cl. ........................................... 341/50; 341/51
(58) Field of Classification Search .................... 341/50, 341/51; 370/395.1
See application file for complete search history.

(56) References Cited

U.S. PATENT DOCUMENTS

| 5,506,580 A | * | 4/1996 | Whiting et al. | ................. | 341/51 |
| 2004/0246966 A1 | * | 12/2004 | Wu et al. | .................... | 370/395.1 |

OTHER PUBLICATIONS

Alistair Moffat, Implementing the PPM Data Compression Scheme, IEEE Transactions on Communications, IEEE Service Center, Piscataway, NJ, US, vol. 38, No. 1 1, Nov. 1990; pp. 1917-1921, XP 000938682; ISSN: 0090-6778; The Whole Document.

Stephan Rein and Clemens Gühmann, Arithmetic Coding—A Short Tutorial and Free Source Code, Internet Article, [Online], Nov. 2005, XP002432479, Retrieved From the Internet: URL:http://www.mdt.tu-berlin.de/Members/rein/files/arithmeticcoding.pdf; [retrieved on May 7, 2007]; The Whole Document.

* cited by examiner

*Primary Examiner* — Jean B Jeanglaude
(74) *Attorney, Agent, or Firm* — Roberts Mlotkowski Safran & Cole, P.C.; David S. Safran

(57) ABSTRACT

A method for data communication, where the data compression and decompression is performed by use of a specific hash table, by which data compression a symbol for each data segment is generated, which symbols are transmitted to the receiver where the symbols are decompressed by use of the specific hash table is modified by the specific hash table being performed as a hash table array, which hash table array generates symbols having at least a hash count and a parity check, in which hash table array the parity check comprises generating of a data string, which data string is compared with a parity stored in the hash table, where if both parities are the same, the data model returns the count in the hash table element for transmission, where a zero count is returned indicating that the data string is not valid in the hash table an no transmission is performed.

11 Claims, 13 Drawing Sheets

The complete functionality of a statistical model (for which we provide the source code in the appendix). Fig. A) illustrates the task of the model for encoding, Fig. B) illustrates the function for decoding. Our particular contribution is the data model, which is illustrated in Fig. 11.

| file | bytes | compression |
|---|---|---|
| 0model.bin | 1010 | 0.0432 |
| 1model.bin | 12436 | 0.497 |
| 2model.bin | 63330 | 2.53 |
| 3model.bin | 117376 | 4.695 |

LOW COMPLEXITY COMPRESSION OF SHORT MESSAGES

BACKGROUND OF THE INVENTION

Field of Invention

The present invention relates to a method for data communication, which method can comprise at least a first data compression performed before transmission, which method further comprises at least a first data decompression. which is performed after the data is received, which method the data compression and decompression is performed by use of a specific hash table, by which data compression a symbol for each data segment is generated, which symbols are transmitted to the receiver, in which receiver the symbols are decompressed by use of the specific hash table.

Compression of short messages is a vital operation for low complexity entities such as mobile phones or wireless sensors. A wireless sensor is characterized by a much larger power consumption in information transmission over the wireless medium than on the operational part. In the mobile phone's world the compression would allow users to use more SMS characters than the provider's default value. Therefore, compression of short messages to be conveyed over the wireless medium seems to be promising in terms of power, costs, and bandwidth savings.

Prediction by partial matching (PPM) is a lossless data compression scheme, where a single symbol is coded taking its previous symbols into account, which are called the symbol's context. A context model is employed that gives statistical information on a symbol and its context. The encoder uses specific symbols to signal the decoder the current context, similar as it is done in Internet protocol header compression schemes 111. The number of context symbols defines the model order and is a basic parameter for the compression rate and the algorithm complexity. The symbol probabilities can be processed by an arithmetic coder, thus achieving superior compression over many widespread compressions schemes as for instance the Zip-Lempel methods W 77, (I-218). However, PPM is computationally more complex and even its recent filterer developments do not allow its application to small, battery driven devices.

There exists a large body of literature on lossless data compression. Most of the work concerns the improvement of compression performance while reducing the computational requirements. In an optimal statistical a model (SAMC) is adaptively constructed from a short text message and transmitted to the decoder. Thus, such an approach is not useful for short message compression, as the overall compression ratio would suffer from the additional size of the context model.

In the scheme PPM with information inheritance is described, which improves the efficiency of PPM in that it gives compression rates of 2.7 bits/byte with a memory size of 0.6 MBytes, which makes PPM readily applicable to low-cost computers. The memory requirements for ZIP, BZWZ, PPI\M, and PPMD were shown to vary from 0.5 to more than 100 MByte.

The most related work is a tree machine is employed as a static context model. It is shown that zip (Info-ZIF 2.3), bzip-Z (Julian Seward version 1.0.2), rar (8. Roshal, version 3.20 with PPMII), and paq6 (M. Mahoney) fail for short messages (compression starts for files larger than 1000 Bytes). In contrast to our work, the method is organized as a tree and allocates 500 kBytes of memory which makes the proposed method less feasible for a mobile device. In addition, our method is conceptually less demanding, which is a key requirement for low-complexity devices. To our best knowledge, this is the first paper that combines lossless short message compression with a low-complexity context modelling scheme.

SUMMARY OF THE INVENTION

It is the object of the invention to perform reliably and fast data transmission between communication devices by data compression. A further object of the inventions is to perform a secure communication between computerized devices. Another object is to perform reliably secure communication to and from or between small battery driven devices.

The object can be fulfilled by if a method for data communication in which at least a first data compression is performed before transmission, at least a first data decompression is performed after the data is received, the data compression and decompression being performed by use of a specific hash table, by which data compression a symbol for each data segment is generated, which symbols are transmitted to the receiver, in which receiver the symbols are decompressed by use of the specific hash table is modified in a way where the specific hash table is performed as a hash table array, which hash table array generates symbols comprising at least a hash count and a parity check, in which hash table array the parity check comprises generating of a data string, which data string is compared with a parity stored in the hash table, where if both parities are the same, the data model returns the count in the hash table element for transmission, where a zero count is returned indicating that the data string is not valid in the hash table an no transmission is performed.

Hereby it can be achieved that the count in the hash table is controlled in that the count is not accepted until the parity check is accepted. In this way it is achieved that before the transmission of a data segment it is controlled that the content of the data segment is correct in relation to the hash table symbol. After the symbol has been transmitted to a receiver it is very important that the symbol is correctly received. Therefore the parity check is performed once again after the symbol has been received to ensure that after the symbol has been received, this symbol is converted to the hash table to the correct data segment.

By ensuring that the parity check is performed at the received data segment it is ensured that it is the correct data segment that is generated at the receiver.

This can lead to a highly efficient and reliable data transmission. Especially if this data transmission is performed as a mass communication between mobile phones it appears to be very efficient because it is not the data content itself that is transmitted, but only the symbols. With the parity check by the receiving mobile phone it is ensured that each data segment received is correct. This can lead to a situation where the symbols comprising hash counts and parity checks is the only information that is transmitted from a mobile phone over the net and further, probably, over a wired communication net towards a transmitter from which the signal at least is transmitted to the receiving mobile phone where the decoding is performed. This can result in a reduction of the data that is communicated by sending an SMS message by at least a factor of 3.5. Developing the correct hash table will result in symbols that are not only indicating each single word but symbols indicate sentences of text which is mostly used. In this way a message comprising five or six widely used sentences can be transmitted by sending and receiving very few data word.

It is performed that the method concerns a specific hash function, comprising a data array in which each element containing two entries, which method further concerns a parity check function, in which parity check function, the string is given to a One-at-a-Time hash function, which function transfers the string of data characters to an integer number within an interval, which interval contains a first table size, which first table size denotes the total number of elements in the hash table.

By using the specific hash function in both the transmitter and the receiver, it is achieved that data can be re-established very efficiently after transmission. By using the specific integer numbers as part of the count that has to be transmitted, the necessary data word which has to be used for transmission can be reduced to having a very specific length.

The required memory and the complexity can be reduced by using a context model, which context model for the first comprises a data model and for the second functions for estimating statistics, which statistics comprises at least a total, a left, and a right count, which counts is generated on the fly, which data model at least comprises the symbol counts.

By using the context model it is achieved that the statistics are also generated. The statistics are used to indicate if a count is used very often or if that count is never used. If a count is never used for a long period of use, there is no longer any need for this count as part of the hash table.

Each single symbol counts can refer to a single node in a data three. The use of a data tree makes will give the result that by computer means it will be rather fast to find the correct node in the data tree. Therefore the data tree is a system for speeding up the functions that have to be performed in a both the transmitter and the receiver.

The data model can be parameterized by just one parameter, which parameter can be the size of the hash table, where each count of the hash table refers to an arbitrarily long string, whereby the model works for each statistical context model order without any changes in the implementation. Hereby it is achieved that the hash table is not limited to containing only single words but it can also contain long strings words, for example often used sentences. Especially in combination with the use of a data tree it is possible in the hash table to read the correct position for a combination of words. The count in the hash table can be a number comprising very few bytes.

A statistical model can consists of an array of elements, where each of the array elements can contains the count and the parity, which numbers are calculated by a more complex statistical context model for adaptive modelling, where the data model consists of a hash table with collision resolving techniques, where training of the context model is performed by the text file, from which text file the training data shall be extracted for compression, while the more complex hash table with linked elements is filled with statistical data. By using the statistical model it is possible to reduce the actual hash table.

When the compression is finished, the amount of statistical data in the data model is reduced, where each linked list is searched for the maximum statistical item count, and the maximum counts are written into the first elements of the linked list, where the remaining elements of the linked lists are deleted. By sorting the hash table where mostly used data are placed in the top of the list and where never used data segments are placed in the bottom of the table, the size of the hash table can be reduced to a size which can be easily be stored in all hand-held electronic devices such as mobile phones.

The appending strings to the counts of the table can be recalled for to calculate the parities, where a parity of one table element is calculated by a logical exclusive-OR operation of the single symbols of one string, for obtaining a low complexity data model, which data model is an array of elements, where each element containing a count and a parity. Hereby a simple data model containing very simple elements is achieved.

A low-complexity data model consists of a subspace of the original data model, which contains the context nodes that are of statistical importance. Hereby it is achieved that a very small model can be used which model comprises all the data necessary for achieving a very efficient data communication.

An indicator to assess the statistical quality of the retained nodes can be the frequency each node is accessed during the compression. Hereby it is achieved that the various nodes are sorted in accordance with the frequency of their use. In practice this means that a new sorting order of the nodes for the user can result in a very fast operating system.

Lossless text compression can be performed by a algorithms comprising a statistical context model, which model comprises an arithmetic coder and a context model library, which context model uses a data structure with linked lists for resolving collisions, where each node of a data tree is represented by a list item, which contains a pointer to a key and selected node statistics comprising a symbol and a total count, where a bit-mask is employed to indicate present successors of the node. Hereby it can be achieved that the data communication can be extremely efficient.

DETAILED DESCRIPTION OF THE INVENTION

Figure 1A:
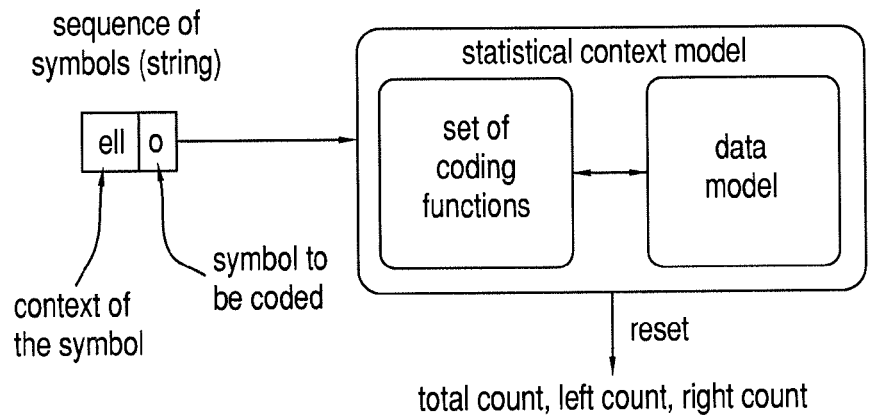
FIG. 1 shows the functionality of a statistic context model.
Figure 1B:
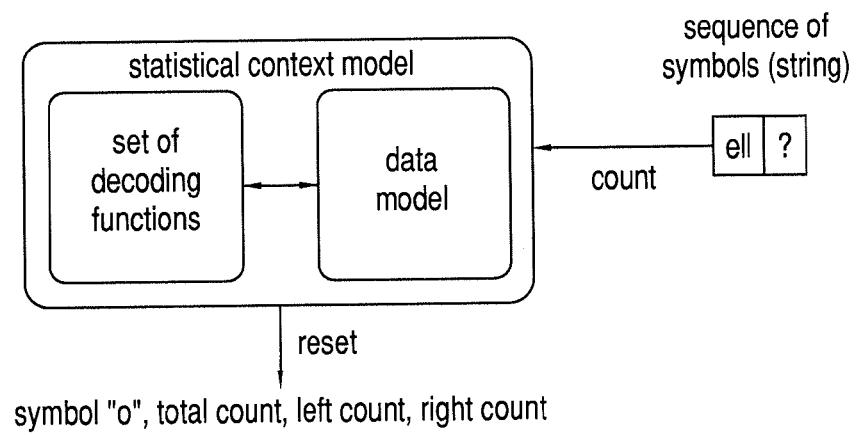

FIG. 1 shows the functionality of a statistic context model. FIG. 1A illustrates the requirements for encoding where the appropriate statistics are returned for each string. FIG. 1B illustrates the function of the model for decoding where a simple count is mapped to the decoded symbol.

When encoding a message, each symbol and its context, which is typically a string of bytes, are given to a statistical context model, which returns/estimates the appropriate statistics, as illustrated in FIG. 1. A widely-used method for storing the statistics is a data three, where each node contains statistics for a given string. To access the nodes, functions for traversing the tree have to be implemented, which in general are computationally demanding. The nodes do not only contain the statistics, but also need pointers to link them. To reduce the required memory and the complexity, we use a context model that consists of a data model and functions for estimating the statistics (i.e. a total, a left, and a right count) on the fly with standard techniques. The data model contains the symbol counts, where a single symbol refers to a node in a data three. The task of the data model is to return the appropriate count to any character array.

Figure 2A:
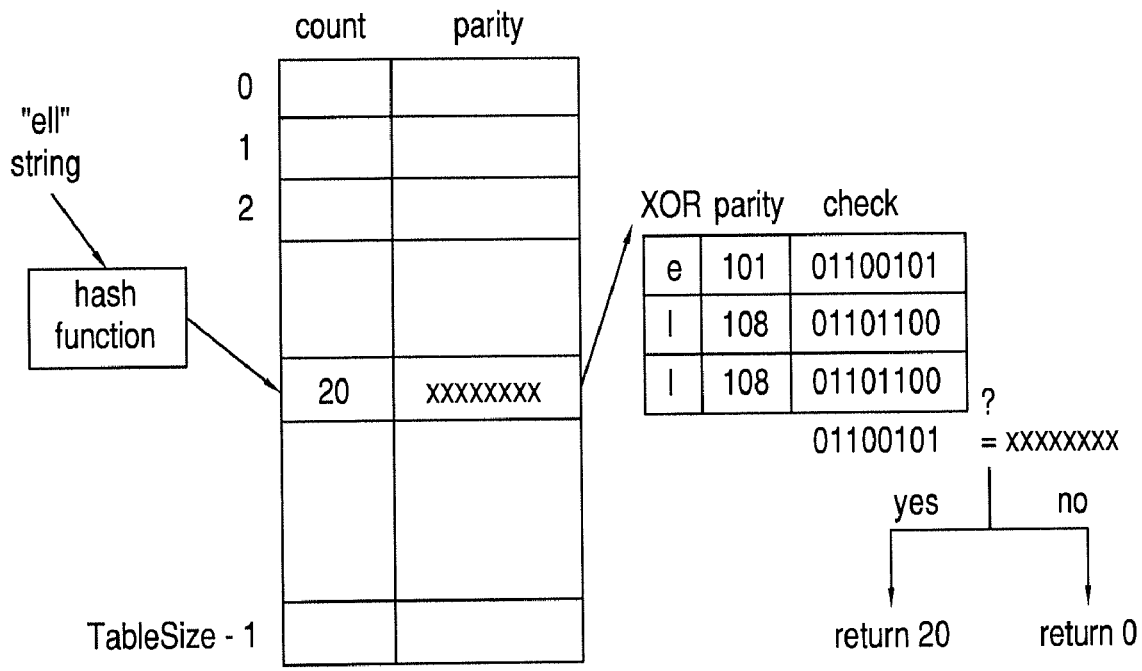
FIG. 2 shows a particular contribution in the data model.
Figure 2B:
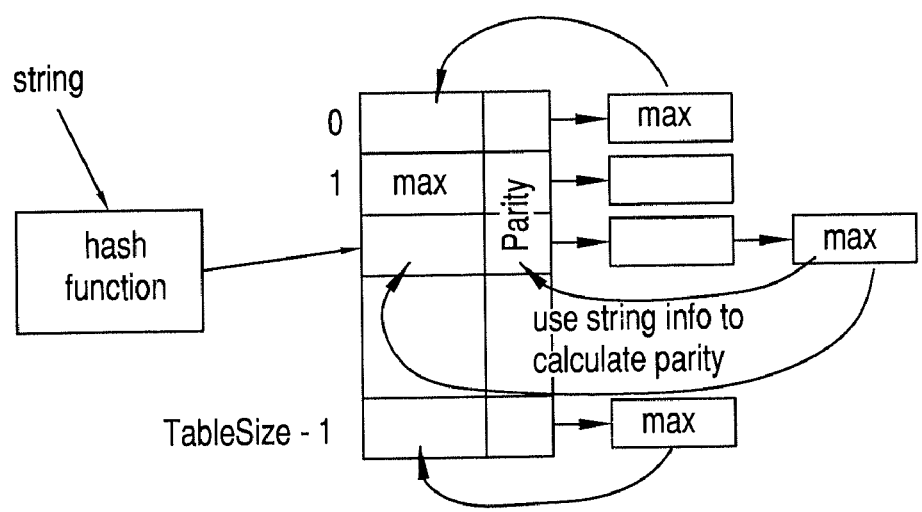

FIG. 2 shows a particular contribution in the data model.

FIG. 2A illustrates the basic parts of the data model: a hash table, each element containing a count and a parity, a hash function and a parity check function.

FIG. 2D illustrates the hash table of the original more complex data model with collision-resolving linked list which is employed to train the low complexity model.

The model consists of a specific hash function, a data array each element containing two entries, and a parity check function, as illustrated in FIG. 2 a). It works as follows. First, the string is given to a One-at-a-Time Hash function, which transfers the string of characters to an integer number within the interval 1), Table size—L), where Table size denotes the total number of elements in the hash table. The estimated hash table element contains a count and a parity byte. Then, the parity of the queried string is computed and compared with the parity in the hash table. If both parities are the same, the data model returns the count in the hash table element. Otherwise, a zero count is returned indicating that the string is not in the model. The parity check is essential as during the encoding/decoding process a large amount of strings are queried the data model for the on the fly estimation of the symbol statistics. The lossless compression/decompression with the data model even works without the parity check; however, the compression performance is significantly deteriorated. Let N denote the model order. For each order, the hash function maps the space of 256N+1 different strings to an array of Table Size elements, resulting in hash function collisions which are not resolved. The task of the hash function is to only map the statistically significant context nodes. A particular advantage of the data model is that it is parameterized by just one parameter, the size of the hash table. Each element of the hash table refers to an arbitrarily long string. Thus, the model works for each statistical context model order without any changes in the implementation. In the next section, we give a method for training the low complexity data model.

The statistical model consists of an array of elements each of them containing a count and a parity. To calculate these numbers we use a more complex statistical context model for adaptive modelling, where the data model consists of a hash table with collision resolving techniques as illustrated in FIG. 2 b). The training of the context model is given as follows. The text file from which the training data shall be extracted of is compressed while the more complex hash table with linked elements is filled with statistical data. Each of the elements contains a string for identification of the symbol and its context. When the compression is finished, the amount of statistical data in the data model is reduced in that a) each linked list is searched for the maximum statistical item count, and b) the maximum counts are then written into the first elements of the linked list, as illustrated in FIG. 2 b). The remaining elements of the linked lists are deleted. The appending strings to the maximum counts of the table are now recalled to calculate the parities. A parity of one table element is calculated by a logical exclusive-OR operation of the single symbols of one string. The keys to the table elements are now discarded, thus obtaining a low complexity data model. The final result is an array of elements each element containing a maximum count and a parity. In the next section we detail a low-complexity method for efficiently storing the so obtained statistical model. Thus, a mobile device can store various types of data (for instance on its flash ROM) as it may manage many different statistical models.

A mobile device does not need to permanently retain the statistical model in its RAM memory. When the compression program is not needed, the statistics can be kept in the program memory. In this section, we describe how the array of counts and parities can be efficiently stored. For our measurements we use models for hash table lengths 16384, 32768, 65536 and 131072 elements As each element requires 2 bytes (symbol count and parity), the statistical models allocate 32, 64, 128, and 256 KBytes of RAM memory, respectively. The models are constructed from the text file book2 from the Calgary corpus [9]. A simple yet effective method for compression of the statistical data can be achieved due to the fact that even with a good hash, many of the elements of the hash table are empty and not employed for the statistical model. An empty element is defined by a zero count.

TABLE I

| | a) | | | b) | |
|---|---|---|---|---|---|
| file | memory [kByte] | size [Byte] | file | memory [kByte] | size [Byte] |
| o2tb-32 | 32 | 16368 | o3tb-32 | 32 | 16450 |
| o2tb-64 | 64 | 30408 | o3tb-64 | 64 | 32892 |
| o2tb128 | 128 | 63060 | o3tb128 | 128 | 117106 |
| o2tb256 | 256 | 73260 | o3tb256 | 256 | 176490 |

SIZES OF THE COMPRESSED VERSIONS OF THE CONTEXT MODEL FOR ORDER 2 IN FIG. A) AND ORDER 3 IN FIG. B). A LOW-COMPLEXITY DEVICE CAN MAINTAIN A SET OF MODELS FOR DIFFERENT TYPES OF DATA.

If an element is empty, there is no need for storage of a parity. To store the counts and the parities the hash table is traversed from its first to the last element. For each element, the count and the parity are sequentially stored. In case of a zero count, a zero byte and a byte for the total number of zero elements in a stream is written on disk.

Thereby, large streams of zero elements are stored by just two bytes. Typically, there exist many streams of zero elements in the data model. The maximum stream size that can be denoted is 256 empty elements. Table I gives the size of different compressed data models in Bytes for the orders 2 in table a) and 3 in table b). We use the so constructed models to obtain the compression results in section V.

In this section is review that the ability of our data model to retain the statistically significant context nodes of a data free. Each data model consists of context nodes that refer to keys of the length If +1 Bytes, where N denotes the model order. Recall that there exist $256^{N+1}$ different keys for each order, thus the space of keys for the higher orders is enormously larger and expectedly more difficult to model. The set S of all possible inputs for the hash function is given as $$S = \sum_{order=0}^{N_{max}} 256^{N+1} \tag{1}$$

and has to be mapped to the space of 1 . . . Table elements, where Table denotes the hash table size. The hash function should distribute the statistically important context nodes uniformly on the hash table.

FIG. 3 shows a context model representing the nodes of the data tree, each node referring to a different symbol having a specific context.

Figure 3A:
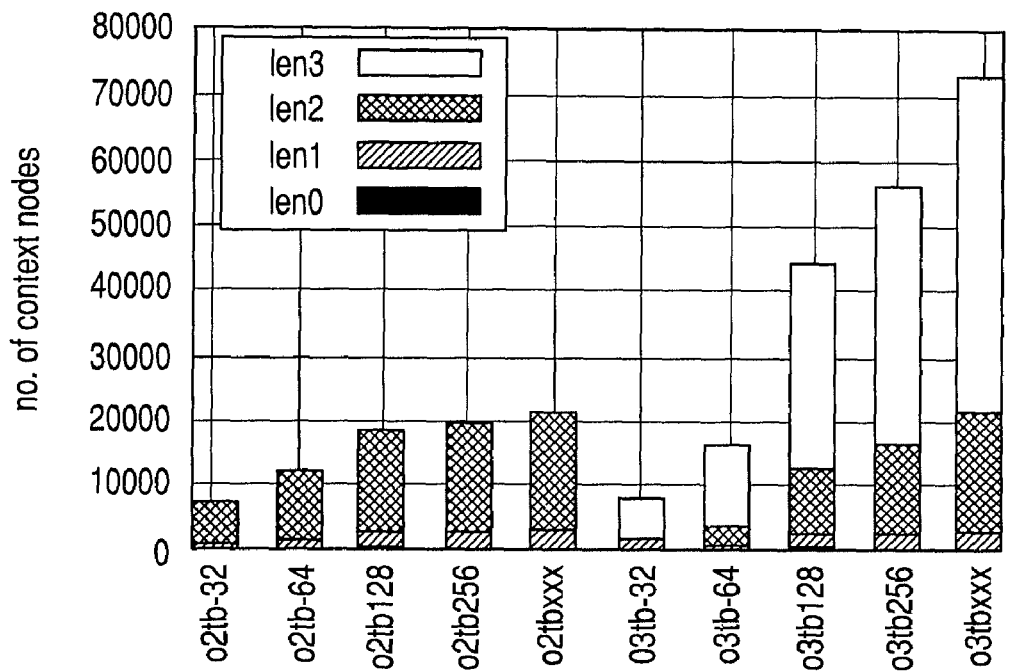
FIG. 3 shows a context model representing the nodes of the data tree.

FIG. 3A classifies the nodes by their context lengths.

Figure 3B:
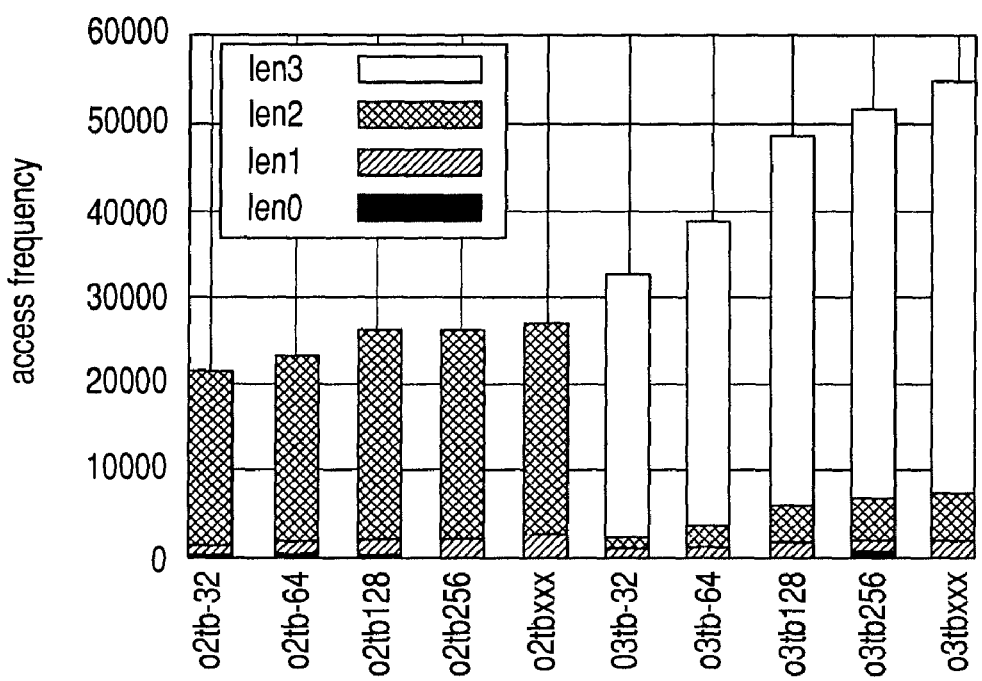

FIG. 3B depicts the frequency of the nodes of a certain context length are assessed. The deep context nodes are more frequently assessed and should be retained by a good model.

In FIG. 3, statistics performance results are given for the models obtained from the training file book2 with 32, 64, 128, and 2b6 kBytes of allocated RAM memory for the maximum orders 2 and 3 (denoted as described in table I), respectively. We compare the models with the data model of PPMc (denoted as tbxxx) that is employed without memory constraints. The measurements were conducted with the One-At-a-Time hash key, to perform without collisions for mapping a dictionary of 38470 English words to a 32-bit result. FIG. 3 a) shows the number of context nodes each model contains, where len0 to len3 refer to the order of the key that is mapped (for instance, len1 refers to a key of 2 bytes and the model order 1). The models o2tb-32 and o2tb-64 discard more or less half of the original model space, which is given by o2tbxxx as 21400. The models o2tb128 and, o2tb256 tend to preserve the space of occurring context nodes, and therefore are expected to result into good compression performance. For order 3, the space of possible context nodes is given as 73191. The models o3th-32 and o3tb-64p reserve less than 16200 context nodes, which is just 22Voo f the original model space. The models o3tb128 and o3tb256p reserve 60% and 77%, respectively. A low-complexity data model consists of a subspace of the original data model, which should contain the context nodes that are of statistical importance. An indicator to assess the statistical quality of the retained nodes may be the frequency each node is accessed during the compression, which is illustrated in FIG. 3 b). Especially for the order 3 models, we conclude that a node of a higher order is on average more frequently accessed than a node of a lower order, for instance the access frequency for len3 context nodes is 452601 for model o3tb256, which is 88% of all node accesses.

However, context nodes of order 3 just allocate 71% of the data structure.

Figure 4:
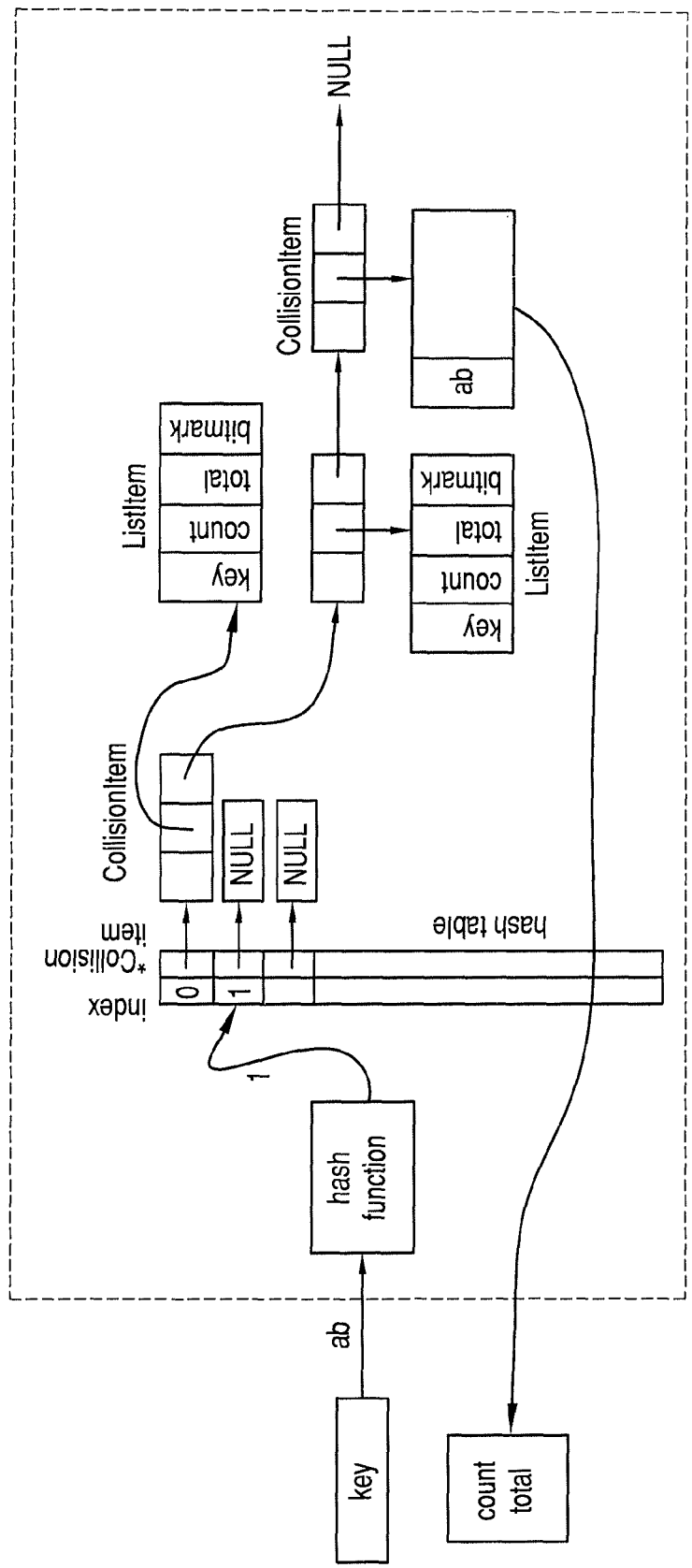
FIG. 4 shows the data structure for the more complex data model.

FIG. 4 shows the data structure for the more complex data model that is employed for acquisition of the statistics for the low-complexity data model. Collisions are resolved by a linked list of collision items, each of them are pointing to a list item.

For the design and evaluation of lossless text compression algorithms with statistical context modelling, we have developed a test bed in c++, which consists of an arithmetic coder and a context model library. The context model uses the data structure illustrated in FIG. 4 with linked lists for resolving collisions. Each node of a data tree is represented by a list item. This contains a pointer to a key and selected node statistics {a symbol and a total count). A bit-mask is employed to indicate present successors of the node. Thus, the computation of the left and right probability is accelerated.

To simplify statistical model refinements we use an interface to the free high-level language software Octave.

Figure 5:
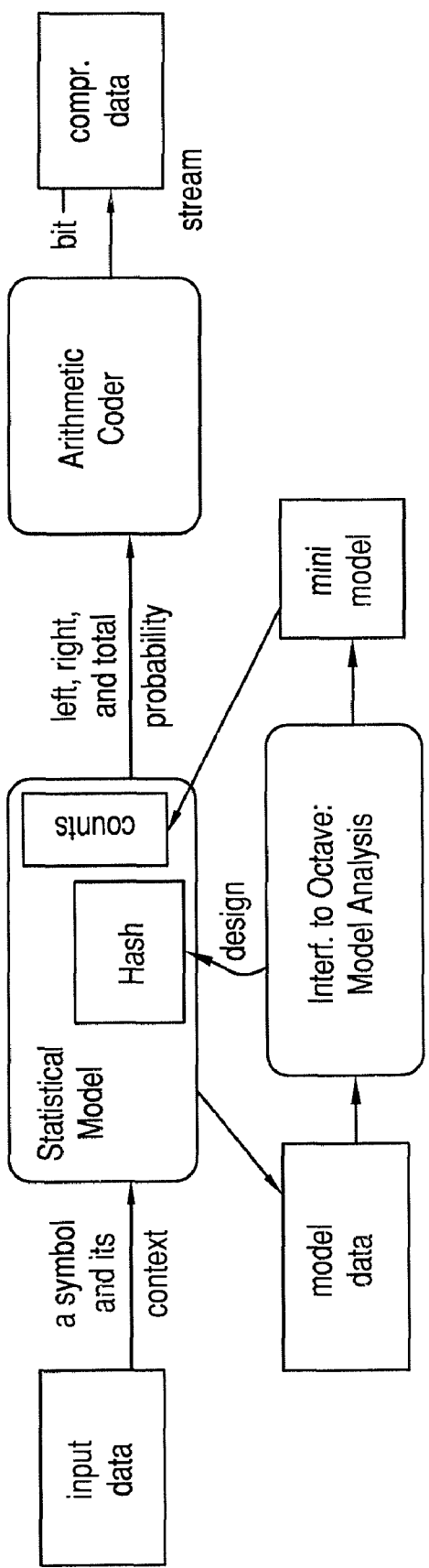
FIG. 5 shows the test bed for designing lossless compression schemes.

FIG. 5 shows the test bed for designing lossless compression schemes. The statistic data is interfaced to the high-level language octave for model refinements.

Our complete methodology for the design of low-complexity compression algorithms is depicted in FIG. 5. This section evaluates the compression performance for the low-complexity compression scheme, which we call from now lcc (low complexity compression). We employ English text files from the Canterbury corpus (alice29, asyoulik, plrabnl2), the project Gutenberg (hrom 110}, hrom 220), the Calgary, and the large corpus (bible, world192, available at http://corpus-.canterbury.ac.nz/descriptions) We first evaluate the compression performance of Icc with the training file book2 from the Calgary Corpus and compare it with the performance of PPMc with a preloaded static model from book2. Importantly, the PPMc implementation has no memory constraints, whereas the Icc scheme is applied with memory sizes ranging from 32 to 256 kBytes.

Figure 6A:
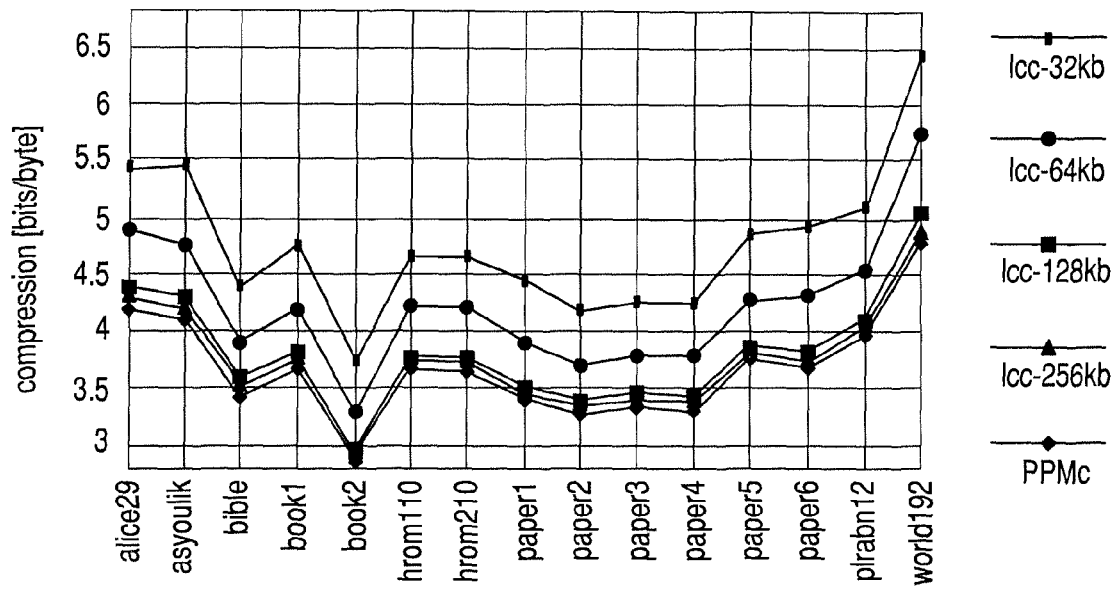
FIG. 6 shows compression performance for LCC with training data.
Figure 6B:
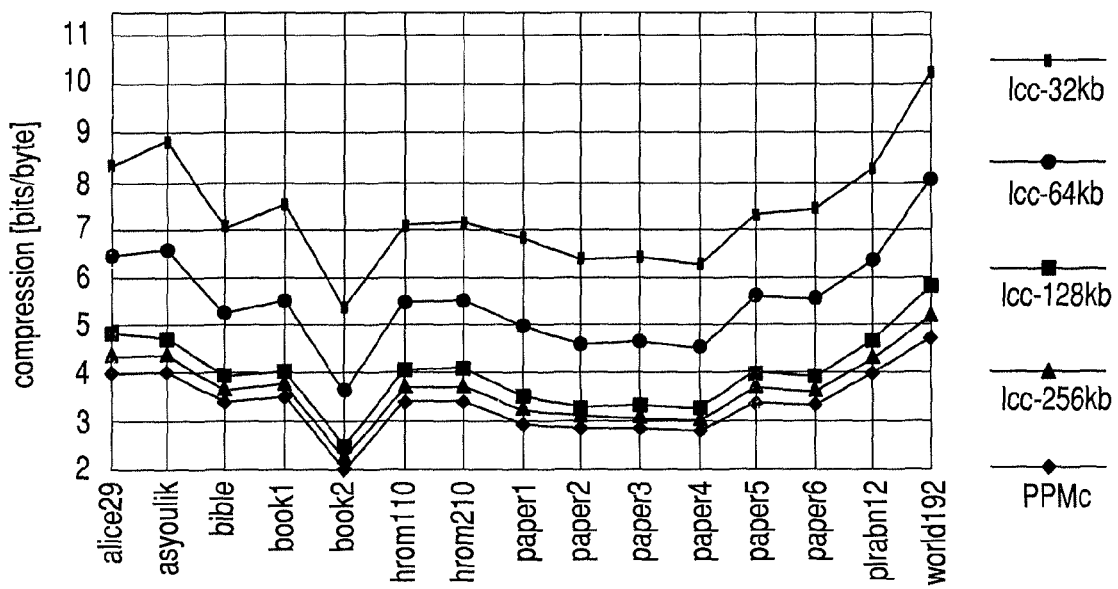

FIG. 6 shows compression performance for LCC with training data from Book 2 for the Order 2 in a) and the order 3 in B. With more memory the LCC model performs very close to the PPMc model without memory constraints.

FIG. 6 a) shows the compression ratios for the complete array of text files for model order 2. A remarkable difference in compression is obvious for the memory sizes 32, 64, and 128 kBytes. The compression for the Calgary Corpus and files from the Gutenberg project varies from 4.25 to 4.3 for a memory size of 64 kByte, and from 3'75 to 3.8 Bits/Byte for a memory of 128 kbyte. The further duplication of memory does result into a small performance improvement of approx. 0.1 BitslByte. This is due to the fact that the compression for 128 kByte is already very close to the compression of the PPMc algorithm with no memory constraints, which similarly performs 0.1 Bits/Byte better than the 256 kByte Icc scheme.

FIG. 6 b) illustrates the compression performance for model order 3. Remarkably, lcc performs worse with the memory sizes of 32 and 64 kByte than for the model order 2. This is due to the fact that the models of higher order have more context nodes and overstrain the smaller hash table. In this case, the compression with 32 kBytes even does not work at all for the data file world192, alice29, and asyoulik and with 64 kB for the file world192. The 128 kByte order 3 model gives better compression than the 64 kByte order 2 model for most of the text files. The 256 kByte order 3 model achieves better compression rates than the best lcc order 2 model for the text files paper 1 to paper 4.

PPMc with the preloaded model performs approx. 0.2 bits per byte better than the 256 kByte order 3 lcc scheme. The 256 kByte lrc schemes for order 2 and order 3 are both very close to the PPMc compression performance.

It is noted note that the evaluation results from FIG. 6 were not obtained to prove the compression performance of lcc for longer text files, but to indicate that the larger lcc context models retain the statistical significant data of the PPMc context model, which we employed without memory constraints FIG. 7 shows the compression ratios for short text sequences of the file paper 4 for lcc with training data from book 2. The data points are depicted together with the 95% confidence intervals. lcc is compared with the PPMc compression scheme using adaptive context modelling. Fig. a) shows that for model order 2 the compression rates nearly stay constant for text sequences larger than 75 Bytes, which similarly holds true for the model order 3 in Fig. b) with the exception of the 32 kbyte order 3 model, which performs comparatively poor like the two PPMc adaptive context models. The order 2 models of 32, 64 and 128 kByte perform around the compression rates 4.3, 4, and 3.5 Bits/Bytes, respectively. Doubling the memory size again does not result into compression improvements. The 64 and 1-28 KByte order 3 models perform with approx. 4.5 and 3.4 Bits/Byte, respectively. The 256 kByte order 3 model gives the best performance of approx. 3.1 Bits/Byte for the larger text sequences.

The results show that especially the order 2 lcc model gives reasonable compression performance while preserving low computational requirements for higher model orders, the size of the hash table has to be enlarged.

Compression ratios ranging from 2.95 to 3.1 for compression of the file hrom210 using training data from book1 is achieved. The better compression performance is obtained with the cost of higher computational complexity and memory requirements of 512 kBytes. In contrast to this approach, lcc is designed as a good and scalable trade-off between complexity and compression performance.

A detailed methodology for lossless compression of short text messages is described in the following. Most of the related work in the field of text compression has been devoted to the development of algorithms/software for compression of long data files on personal computers. Due to their complexity and their adaptive statistical model these algorithms are not applicable for short message compression on low-complexity devices.

A specific static context model is detailed that projects highly complex statistics on a succinct data array with statistical integer numbers and parity bytes. One key component is the usage of a smart hash key that equally fills the data model. We achieve a compression performance around 3.5 bits per byte for short text sequences larger than 75 Bytes using an order 2 context model of 128 kBytes with typical training data. The compression is improved by 0.4 bits per bytes with a model order of 3. A good trade-off between compression efficiency and computational requirements is the 64 kByte model of order 2, which cuts the text sequences in half if they are larger than 75 Bytes. We note that a software provider can even significantly improve the compression performance by using training data that is typical for the users.

The further description concerns the offline optimization of context models that were gathered by single training files with specific low-complexity algorithms, an analysis of other types of hash keys and their effect on the compression, the development of more effective and learning hash-keys for data modelling, and an analysis of the compression performance for other data types.

The software is implemented for the complete SYMBIAN OS series 60 platform. Currently we perform power consumption and complexity measurements on those architectures. Later, we will port the software towards JAVA to make it available to a larger number of mobile phones. With such a software, cell phone users may cut their costs for short message services in half.

Figure 7A:
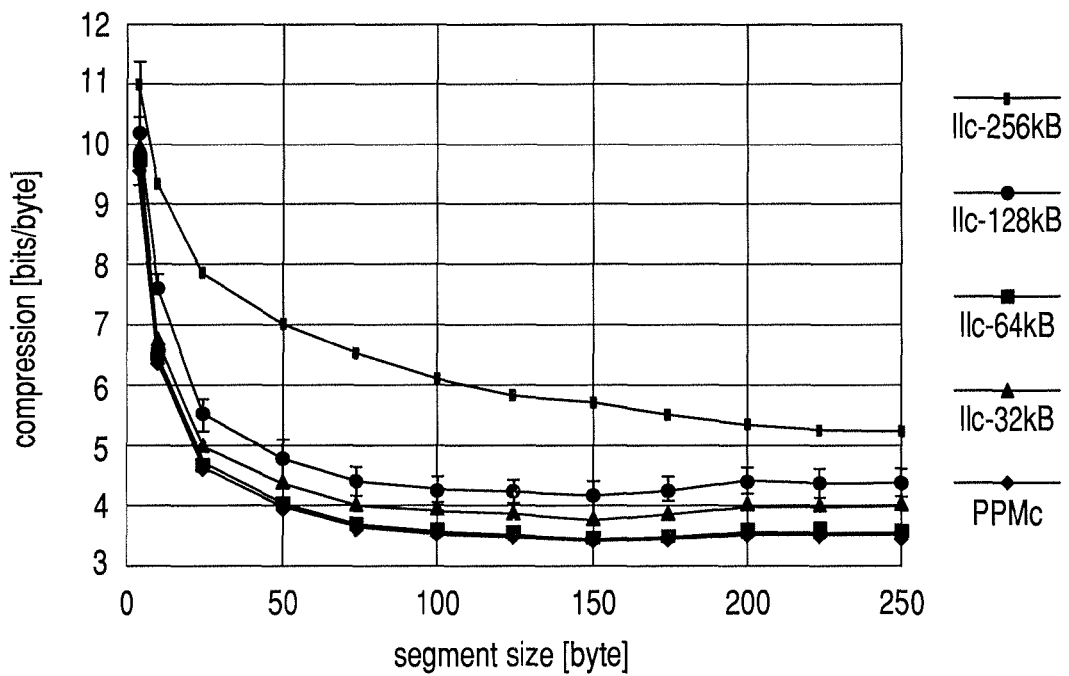
FIG. 7 shows LCC compression performance for short messages.
Figure 7B:
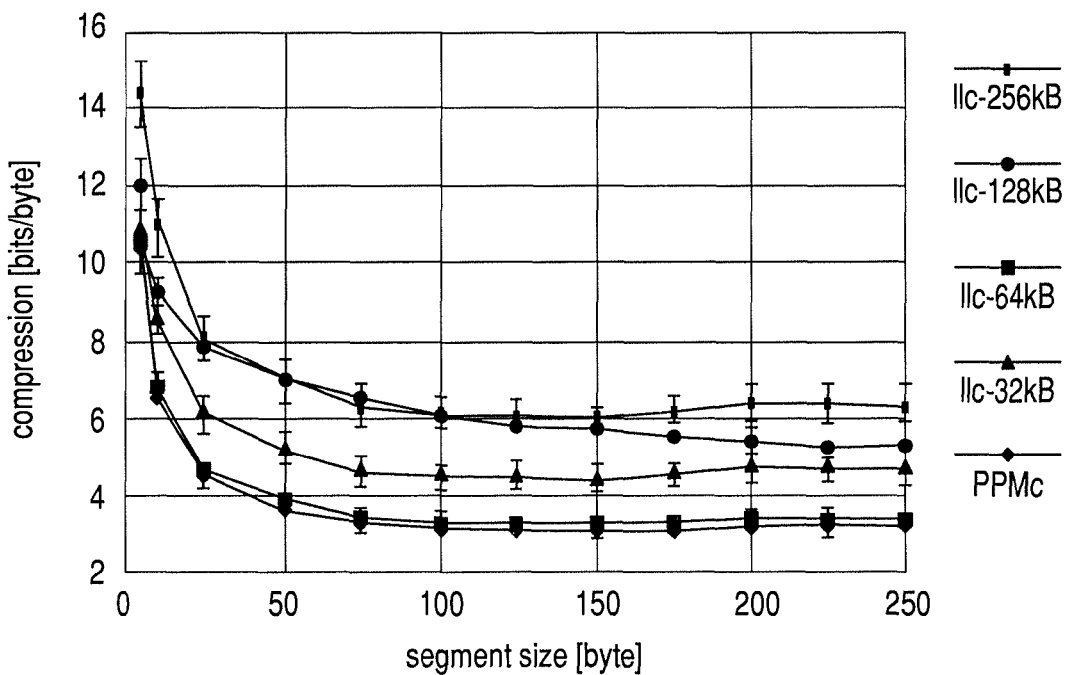

FIG. 7 shows LCC compression performance for short messages for Order 2 in FIG. 7A and Order 3 in FIG. 7B. PPMc without a preloaded model and the 32 kilobytes Order 3 model fail for short messages. The order model indicates the ability of LCC to provide a scalable trade-off between computational requirements.

Figure 8:
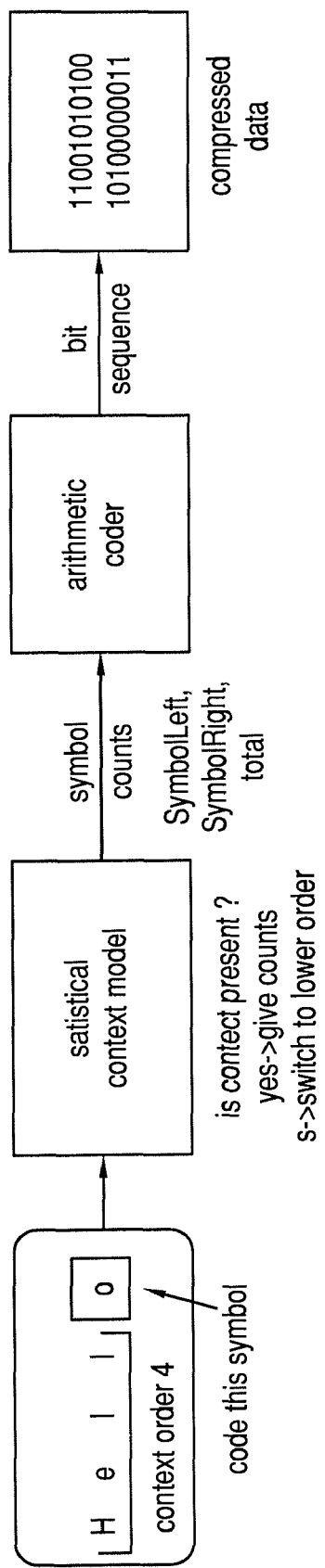
FIG. 8 shows principles of data compression schemes predicted by partial matching (PPM).

FIG. 8 shows principles of data compression schemes predicted by partial matching (PPM). A context model estimates simple statistics that are passed to an arithmetic coder.

Figure 9A:
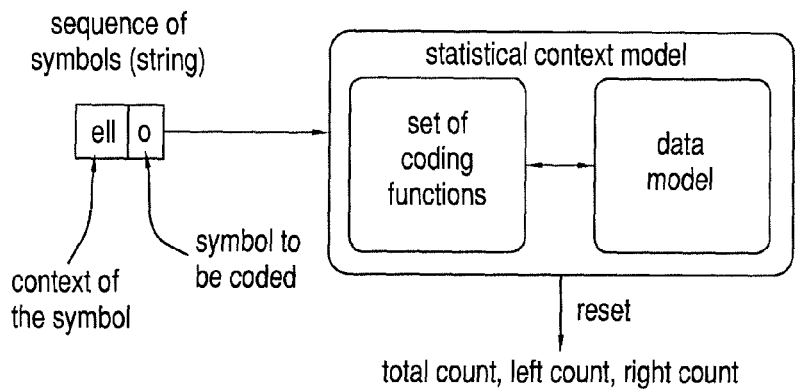
FIG. 9 shows the complete functionality of a statistical model.

FIG. 9 shows the complete functionality of a statistical model, and FIG. 9A shows the task of the model for encoding.

Figure 9B:
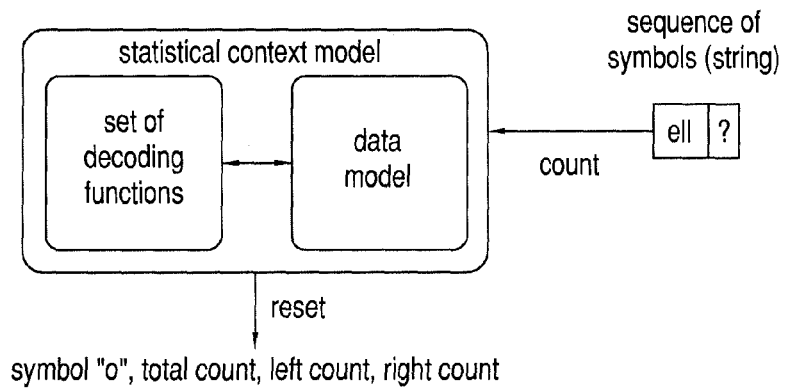

FIG. 9B illustrates the function for decoding.

Figure 10:
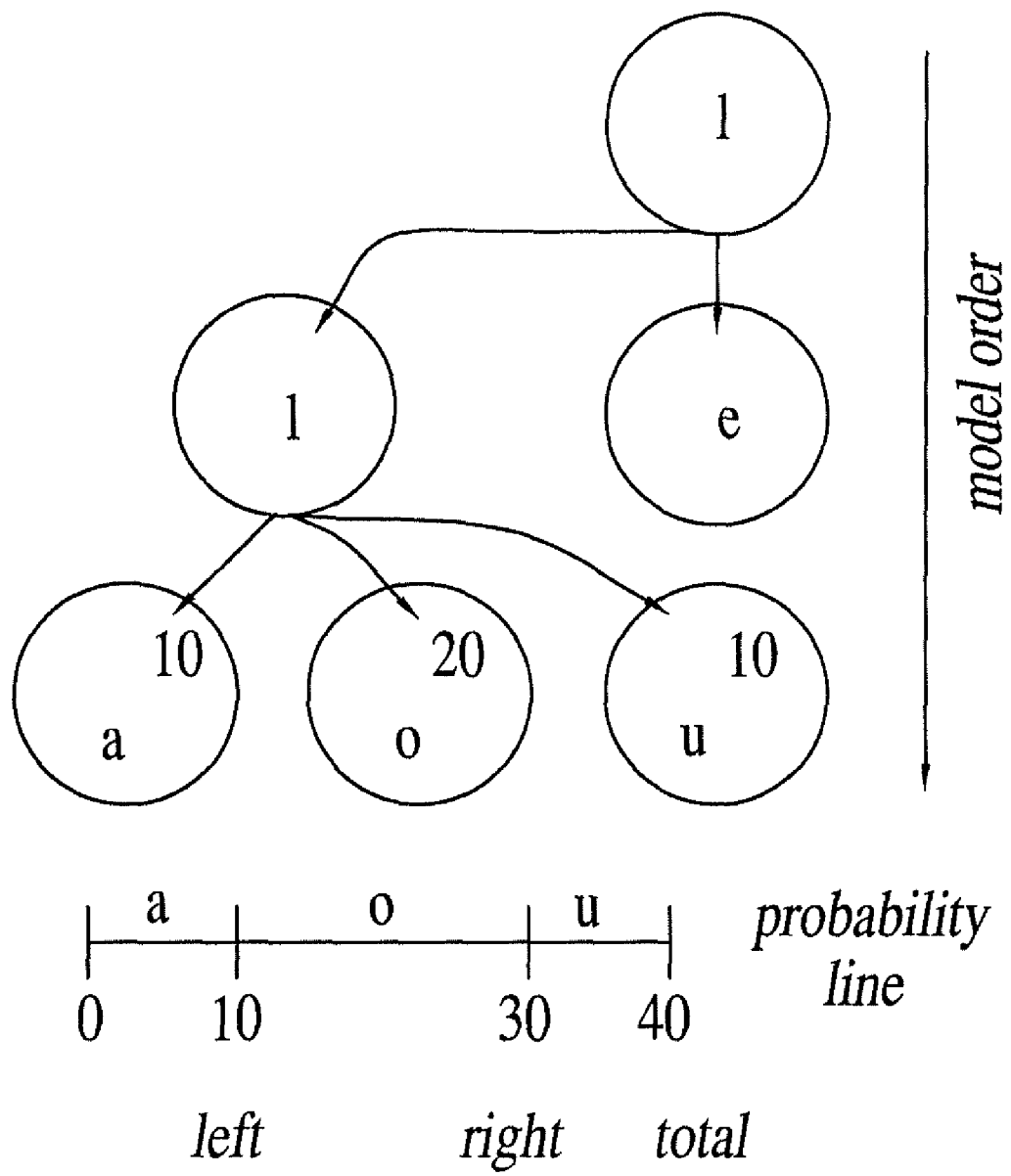
FIG. 10 shows an example of calculation of the symbol probability.

FIG. 10 shows an example of calculation of the symbol probability by means of a data tree model: The tree is equipped for the symbol 0 with the context LL. The model gives a symbol count of 20, the left, the right and the total probability are calculated on the fly. For this calculation all symbols of the probability line before and after 0 are taken into account. In our methodology the symbol statistics are computed on the fly as well. However, instead of a tree, we propose a much more efficient data model that is organised by a hash function.

Figure 11A:
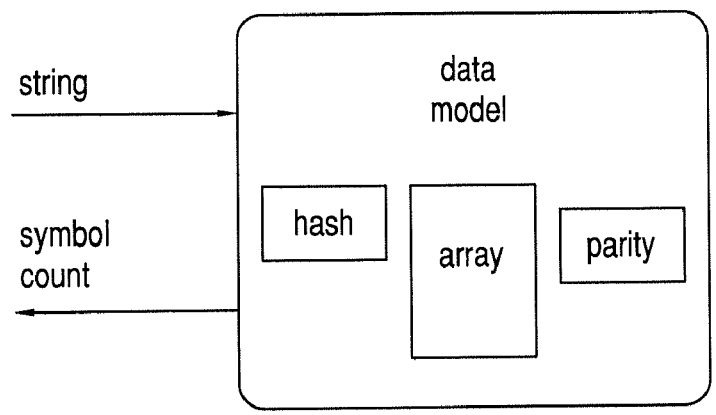
FIG. 11 shows the data model.
Figure 11B:
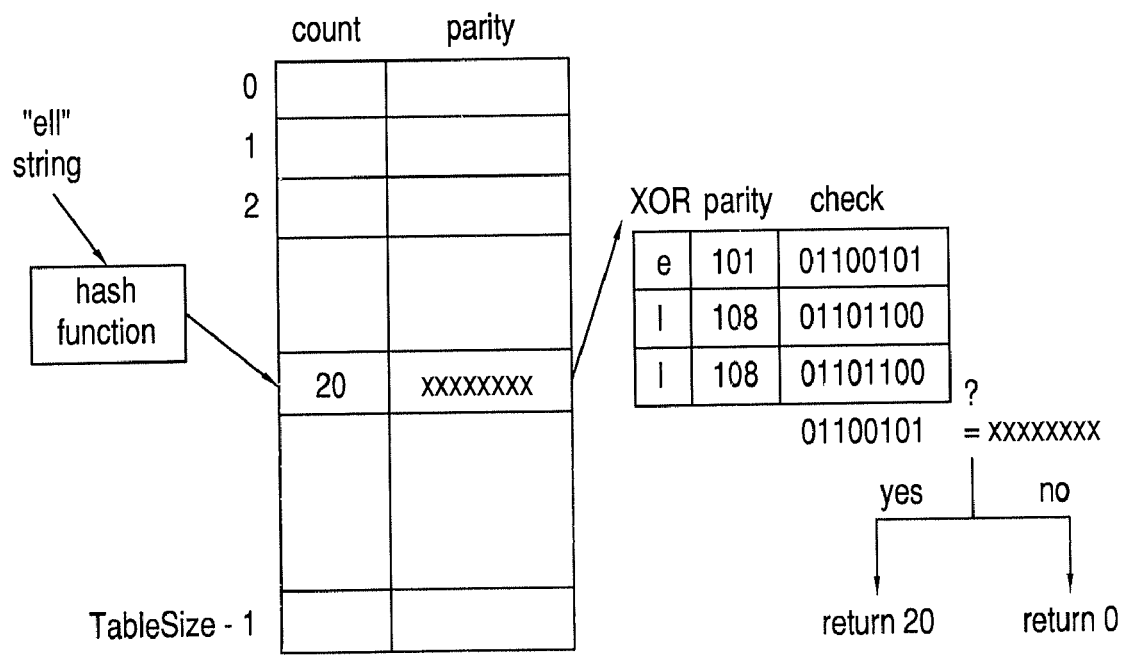

FIG. 11 shows the data model, and FIG. 11A describes the functionality. FIG. 11B illustrates how the data are organised and verified by a parity check function.

Figure 12A:
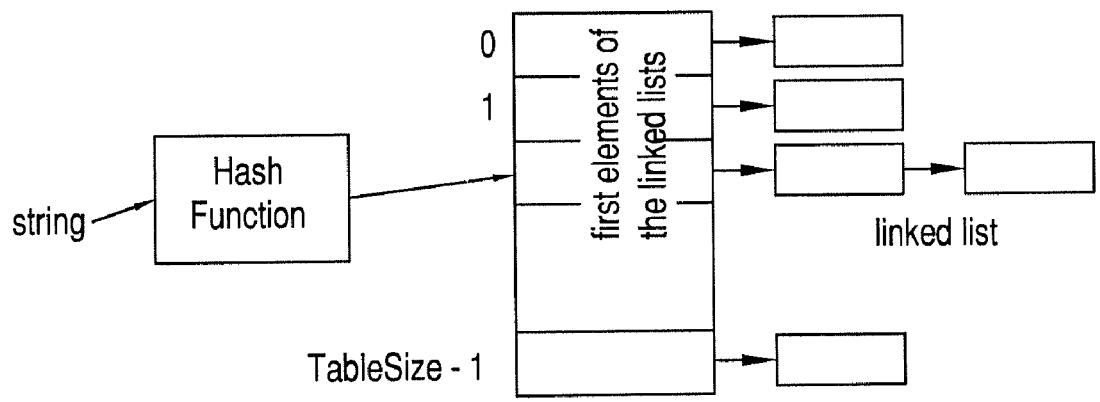
FIG. 12 shows the size of the statistical data model after compression.
Figure 12B:
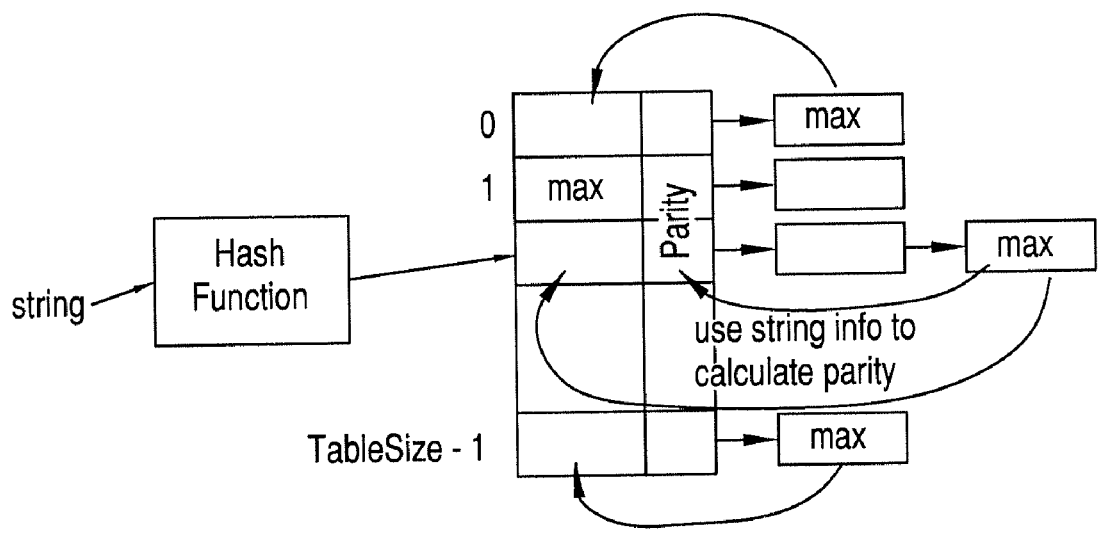

FIG. 12 shows the size of the statistical data model after compression. Each data model originally takes up 200 kilobytes. The data are extracted from the File Book 2 from the category corpus. The third column gives the compression ratio in bits per byte.

Figure 13:
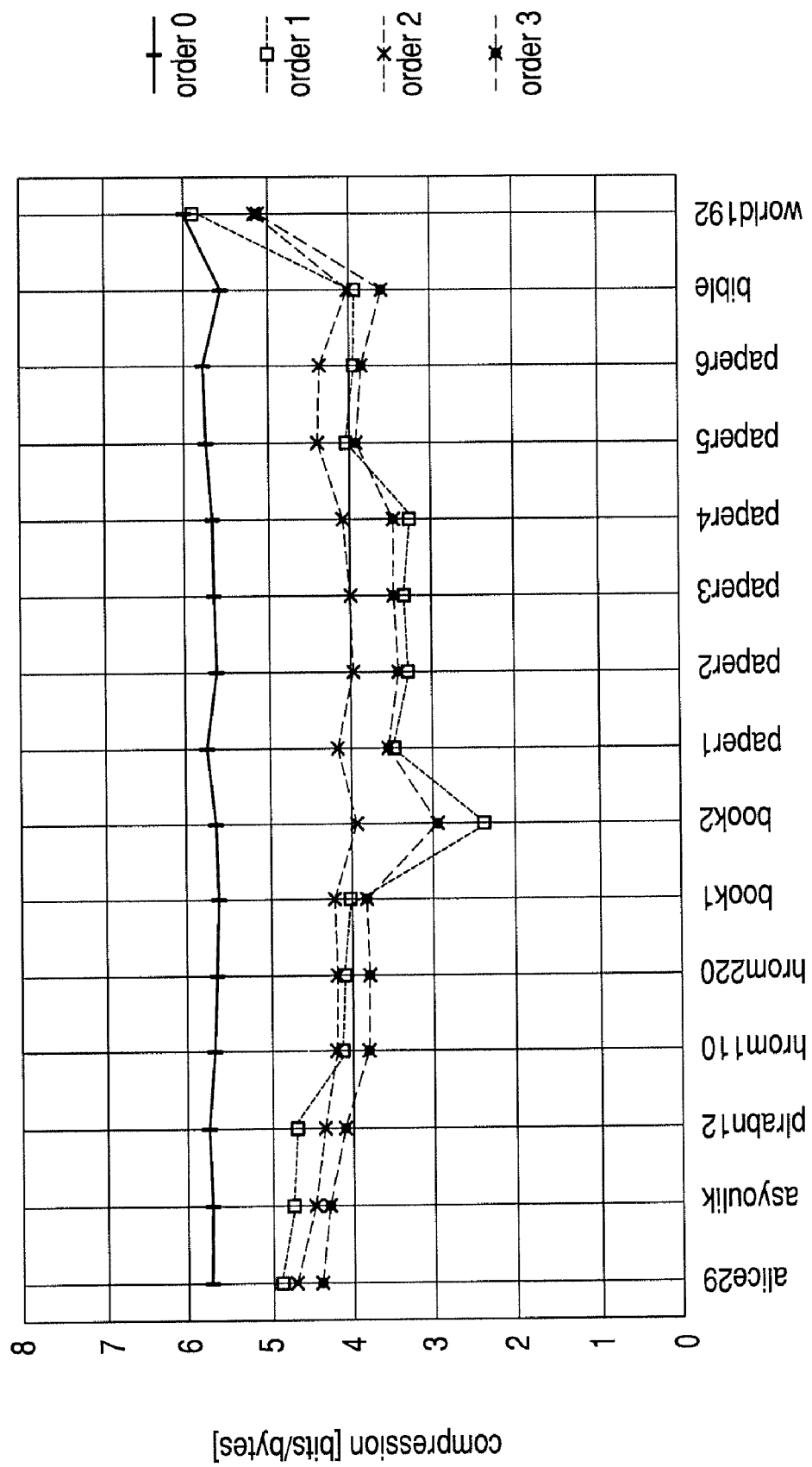
FIG. 13 shows compression performance for the low-complexity.

FIG. 13 shows compression performance for the low-complexity compression algorithm using training data from Book 2. The number in bits per byte reflects the mean compression rate for arbitrarily long messages because a statistical context model is employed that is not updated during compression.

In the following is described a low-complexity scheme for loss less compression of short text messages. The method uses arithmetic coding and a specific statistical context model for prediction of single symbols. The particular contribution is a simple yet effective approach for storing highly complex statistics in a succinct yet effective data model that can easily be trained by text data. The proposed model already gives good compression rates with a RAM memory size of 128 kbyte, thus making lossless data compression with statistical context modelling readily applicable to small devices like wireless sensors or mobile phones.

In the following two general problems with PPM are discussed, a) the large RAM memory requirements and b) the typically poor compression of PPM for the first sequence of symbols. This can be solved by a) with a single, specific hash table array that combined with a hash key and a parity check form a data model for complex statistics. By use of a static context model with an elementary dimension reduction technique for efficient storage of the model in the RAM memory. The model can be trained with a text file that is in ideal case typical for the data to be compressed.

By employ of a computationally less demanding static context model in contrast to the general concept of adaptive context modelling in PPM, where the statistics are gathered and updated during the compression.

In the following, a low-complexity methodology is described for lossless compression of short text messages. The method uses arithmetic coding and a statistical context model for prediction of single symbols prediction by partial matching. Our particular contribution is a simple yet effective approach for storing highly complex statistics in a simple and succinct data model that is employed during the compression and can easily be trained by a single text data file. The proposed data structure makes lossless data compression with statistical context modeling readily applicable to small devices like wireless sensors in sensor networks or mobile phones.

A novel methodology is presented for lossless compression of short text messages generally, text compression algorithms were developed for longer data files to spare space on hard disks, take for instance the widely employed zip compression method, which is based on the Zip-Lempel algorithm. To give an example on short message compression we compress the message test.txt, which is given as follows:

The original messages has 191 bytes, the compressed version of the message using our compression algorithm takes 132 Bytes for model order 0 to 88 Bytes for model order 3:

```
 1    $ ls
      -l test.*
 2    -rw-r-r-    1    rein    Kein    191    Aug    30    15:35    test.txt
 3    -rw-r-r-    1    rein    Kein    132    Aug    30    15:38    test.0 dat
 4    -rw-r-r-    1    rein    Kein    102    Aug    30    15:38    test.1 dat
 5    -rw-r-r-    1    rein    Kein     89    Aug    30    15:37    test.2 dat
 6    -rw-r-r-    1    rein    Kein     88    Aug    30    15:38    test.3 dat
 7    -rw-r-r-    1    rein    Kein    163    Aug    30    15:30    test.gzip
 8    -rw-r-r-    1    rein    Kein    129    Aug    30    16:31    test.bloom
 9    -rw-r-r-    1    rein    Kein    149    Aug    30    16:40    test.shak
10    -rw-r-r-    1    rein    Kein    257    Aug    30    16:37    test.slim
11    -rw-r-r-    1    rein    Kein    140    Aug    30    16:42    test.smi
```

The other files are results of the text compression programs gzip (version 1.3.5), PPM72 from C. Bloom (version 0.81, May 2OO4), PMII from D. Shakarin (variant I, April 2002), the software slim from S. Voskoboynikov (September 2004, version 0.23), and PPMN from M. Smirnov (2002, version 1.00b1).

Prediction fu Partial Matching

Prediction by partial matching (PPM) is a general concept for losslesst text compression. It is based on a statistical model, where a single symbol is assigned a probability in dependency on its previous symbols, which are called the symbol's context. The calculated probability is then given to an arithmetic coder thus transferring the symbol into a binary sequence. For our method, we use the concept of PPM and extend/modify it for low-complexity compression of short messages. We do not describe arithmetic coding and statistical modeling in theory] for arithmetic coding. Details on statistical context modeling. A short tutorial on arithmetic coding and statistical context modelling is following. Generally, PPM employs an adaptive statistical context model for the compression. The statistics are gathered during the compression. Thus, the compression for the first symbols is typically poor. For compression of a short message we propose a static context model which has to be loaded into the memory before the compressions tarts.

In Section II, d a low complexity data model for the compression/decompression is described. The model can be trained by a single text file while retaining useful statistics for unknown text files. To keep compression algorithm simple the model is not updated during the compression. In Section III we give the compression performance of the proposed method for text files from four different benchmark data libraries. The model already achieves reasonable compression with a data array of 200 kBytes. The last section summarizes the findings and details the further investigations. In the next subsection we give a short overview on related literature.

C. Related Literature

There exists a large body of literature on losslesst ext compression Most of the work concerns the improvement of compression performance while reducing the computation requirements, a data model with different hash tables for each model order is employed. The idea of using hash tables for context modelling is similar to ours, however, the approach employs different hash tables for each model order (we only employ one table for any model order) with complex collision resolving techniques and is not applicable for low-complexity short message compression.

When using adaptive models, the memory requirements are less demanding as the model permanently adapts to the current statistics. The adaptive context model only retains statistical information for a limited part of a specific data file, whereas a static context model must contain general statistical information that is relevant for a large amount of different types of text files. However, the usage of a static context model simplifies the algorithm in that there is no need for computation of an update of the statistics. In adaptive modeling, the coding of a single symbol can require exhaustive modifications of the complete context model. For the compression of a short message these computations do not make sense due to the scarce statistical information in short data files. We note that the adaptive construction of an optimal statistical model from a short text message requires the transmission of the model to the decoder. Thus, such an approach is not useful for short message compression, as the overall compression ratio would suffer from the additional size of the context model. To our best knowledge, the compression of short messages has rarely been addressed in the literature. The most related work on short message, where a tree machine is employed as a static context model. The difference to our work is that the statistical model is organized as a tree, which allocates 500 kBytes of memory, whereas we attain comparable results with a data array that needs 200 kBytes of memory for the statistical model, which is much more feasible for a mobile device. In addition, our method is conceptual less demanding and can be implemented with just a few pages of source code, a key requirement for low-complexity devices.

FIG. 1 indicates a technical description of the short message compression method for the general principle of encoding a message. there is proposed the employment of a static context model for the coding/decoding process. This model has to be loaded into the memory before the compression/decompression can start. More specifically, the statistical context model is described, which allows for the compression when combined with a coding system. In the next sections, in a first explanation of the functionality of a statistical context model is described. Then, the specific contribution is described, a data model which allows for low-complexity statistical context modeling. This model describes how the model can be trained and finally gives a method for storing a compressed version of the model in a file. This allows for development of succinct software to be downloaded from the internet for a cell phone etc., where the statistics are already integrated.

FIG. 2 gives a general description of the functionality of a statistical context model. When encoding a message each symbol and its context are given to the model. The context model checks whether the string is in his data model and computes the statistics for the symbol, which are called left, right, and total counts. Generally, the data model does not contain the complete statistics due to memory constraints and to spare computationally exhaustive functions for updating the model, it just contains the symbol's count. Therefore, the complete statistics for one symbol are calculated on the fly, as illustrated in FIG. 3. To estimate the statistics for the symbol "o" with the context "ll" in the data tree all symbols on the probability line before and after "o" have to be taken into account. For the encoder, the statistical context model contains a function for calculating the symbol's statistics with a given context. The decoder contains a function for estimating a symbol from a given symbol count (which is calculated by the arithmetic decoder), more specifically, it searches the appropriate probability line for the interval the symbol count is located in.

For better readability, sometimes the process coding/decoding just called coding, especially when it refers to arithmetic coding. In the implementation, the model even maintains the context. Thus, only the current symbol to be coded is given to the model.

The figure does not illustrate the Escape probability, which is located at the border of the probability line.

For encoding and decoding the context model employs a data model, which gives the count of a symbol with a specific context. This data model can be organized as a file similar as illustrated in FIG. 3. In such a model, the single nodes have to be connected by branches/pointers o that each node of the tree can be accessed. Computationally demanding functions axe necessary to navigate through the tree. In the next section, our method for realizing such a data model is explained by projection of the complex statistics on a single array of integer numbers thus achieving a low complexity method for management of high complexity statistics.

B. Parity Hash Table for Statistical Modeling

In this section, the data model is described that is propose for short message compression. The data model is part of the statistical context model. It returns a count for a specific character array, which contains a symbol and its context, as illustrated in FIG. 4. The concept of our data model is illustrated in FIG. 4. The model consists of a specific hash function, a data array each element containing two entries, and a parity check function. The model works as follows. First, the sting is given to a specific hash function, which transfers the string of characters to an integer number within the interval [O,TableSize—1], where the table size gives the number of elements of the hash table. We have chosen the hash function One-at-a-Time Hash. The estimated hash table element contains a count and a parity byte. Then, the parity of the data string is computed and compared with the parity in the hash table. If both parities are the same, the data model returns the count in the hash table element" otherwise, a zero count is returned. The parity check is essential as during the decoding process a large amount of strings are queried the data model for the on the fly estimation of the appropriate symbol interval on the probability line. Without such a parity check, the data model and the compression do not work, because the data model just maintains the symbol stings that typically appear in textual data files. The parity check is one of the key component for managing highly complex statistics in a single array of integer numbers, as otherwise the strings that refer to each table element would have to be stored separately in each element of the hash table. Such a method would significantly enlarge the computational and memory requirements as additional data bins would be necessary to store strings of any length for each table element.

A particular advantage of the data model is that it is parameterized by just one parameter, the size of the hash table. Each element of the hash table is related to an arbitrarily long string. Thus, the model works for each statistical context model order. For higher model orders it is advisable to enlarge the hash table length.

Another key component (to be explained in the next section) is the employment of z smart hash function, which should know which stings typically appear in textual data. In the next section, we give a method for training the low complexity data model.

C. Training the Model

In this section described the methodology for training the low-complexity statistical context model. A method for estimation of the array of numbers that have to be loaded into the data model before the compression/decompression can start. This calculation is done offline and is not part of the mobile device, however, the result of this calculation is part of the low-complexity data compression software.

The statistical model consists of an array of elements each of them containing a count and a parity. To calculate these numbers we use the more complex statistical context model for adaptive context modeling, where the data model consists of a hash table with collision resolving techniques, as illustrated in FIG. 5. The training of the context model works as follows. The text file from which the training data shall be extracted of is compressed while the more complex hash table with linked elements is filled with statistical data. Each of the elements contains a string for identification of the symbol and its context. When the compression is finished, the statistical data in the data model is simplified in that 1. each linked list is searched for the maximum statistical count, and 2. the maximum counts are then written into the first elements of the linked list, as illustrated in FIG. 5. The remaining elements of the linked lists are deleted thus obtaining a low complexity data model. The appendant strings to the maximum counts of the table are now recalled to calculate the parities. A parity of one table element is calculated by a logical exclusive-OR operation of the single symbols of one string. The final result is an array of elements each element containing a maximum count and a parity. A compressed version of this array is written on disc, to be detailed in the next section.

D. Storage of the Model

This section describes how the array of parities and counts are stored. For our measurements we use a hash table with 100000 elements, each of the elements containing a count and a parity. Thus, the statistical model allocates 200 kbytes of memory. A software for a mobile device needs to load the statistical data into the RAM memory, therefore, it has to maintain the statistical data. We here describe a simple yet effective method for compression of the statistical data thus allowing the development of a software that allocates a small amount of program memory which is typically a flash ROM.

Generally, many of the elements of the hash table are empty and not employed for the statistical model. An empty element is defined by a zero count. If an element is empty, there is no need for storage of a parity. When the model has to be written on disk the compression is performed as follows. The hash table is traversed from its first to the last element. For each element, the count and the parity is sequentially stored. In case of a zero count, a zero byte and a byte for the total number of zero elements in a stream is written on disk. Thereby, large streams of zero elements are stored by just two bytes. Typically, there exist many streams of zero elements in the data model. The maximum stream size that can be denoted is 256 empty elements. Table I gives the compression performance of different models with the order ranging from 0 to 3. The models are constructed from the text file book2 from the Calgarycorpus. The more sparsely the hash table is filled, the better is the compression. This can provide a software for construction of statistical on text models. This model is constructed to obtain the compression results in the next section.

III. RESULTS

In this section we give compression results for our low complexity text compression algorithm. For the performance evaluation we employ text files from the Canterbury corpus, the project Gutenberg 1271, the Calgary

TABLE II

THE TEXT FILES FOR THE COMPRESSION PERFORMANCE EVALUATION.

| file | lines | words | bytes | Type | corpus |
|---|---|---|---|---|---|
| alice29 | | | 152089 | Carol: Alice's adventures in | Canterbury |
| asyoulik | | | 125179 | wonderland | |
| plrabn12 | | | 481861 | Shakespeare (play): As you like it Milton (poetry): Paradise lost | |
| hrom110 | | | 679294 | The history of Rome, Book I | project |
| hrom220 | | | 669362 | The history of Rome, Book II | Gutenberg |
| book1 | 16622 | 141274 | 768771 | Hardy: Far from the madding | Calgary |
| book2 | 15634 | 101221 | 610856 | crowd | |
| paper1 | 1250 | 8512 | 53161 | Witten: Principles of computer | |
| paper2 | 1731 | 13829 | 82199 | speech | |
| paper3 | 1100 | 7219 | 46526 | Witten, Neal and Cleary: | |
| paper4 | 294 | 2166 | 13286 | Arithmetic coding for data | |
| paper5 | 320 | 2099 | 11954 | compression | |
| paper6 | 1019 | 6753 | 38105 | Witten: Computer (in)security Witten: In search of "autonomy" Cleary: Programming by example revisited Cleary: A logical implementation of arithmetic Cleary: Compact hash tables using bidirectional linear probing | |
| bible | | | 4047392 | The King James version of the | the large |
| world192 | | | 2473400 | bible The CIA world fact book | corpus |

4 DIFFERENT CORPORA WERE USED TO ESTIMATE THE MEAN COMPRESSION PERFORMANCE FOR SHORT MESSAGES. THE CALGARY AND THE CANTERBURY CORPUS ARE THE MOST REFERENCED CORPORA IN THE FIELD OF TEXT COMPRESSION.

and the large corpus (available at http://corpus.canterbury-.ac.nz/descriptions). A short description of the files is given in Table III. FIG. 6 shows the compression performance in [bits per byte] when using training data from the text file book2. Importantly, the compression results in [bits per byte] reflect the mean compression performance for arbitrarily long messages/texfiles: Due to the usage of a static context model the compression is kept almost constant during the processing of the whole array of text symbols of a data file. A good compromise between compression performance and computational requirements is the model order 2, for which the compression varies from 3 bits to 5.1 bits per byte. The more similar the text data is to the training data, the better the compression. If the text data is statistically very different from the training data, z higher model order does not result into better compression performance.

IV. CONCLUSION AND FURTHER INVESTIGATIONS

This report i describes in details our methodology for lossless compression of short text messages. Most of the related work in the field of text compression has been devoted to the development of algorithms/software for compression of longer data files on personal computers. Due to their complexity and their adaptive statistical model these algorithms are not applicable for short message compression on low-complexity devices.

A detailed specific static context model has been described that projects highly complex statistics on a simple data array with statistical integer numbers and parity bytes. One key component is the usage of a smart hash key that equally fills the data model. A compression performance better than 4 bits per byte is achieved for our primarily selected training file for a wide range of different text data files from different benchmark collections for evaluation of compression programs. We note that a provider can even significantly improve the compression performance by using training data that is typical for the users.

A further investigation can concern the offline optimization of context models that were gathered by single training files with specific low-complexity algorithms, an analysis of other types of hash keys and their effect on the compression, the development of more effective and learning hash-keys for data modelling, and an analysis of the compression performance for other data types.

We are planning to provide a free sample software for our short message compression method on http://kom.aau.dk/project,/mobilephone. The software will be applicable to the complete NOKIA cell phone platform. With such a software, cell phone users can cut their costs for short message services by half.

What is claimed is:

1. A for data communication, which method comprises at least a first data compression performed before transmission, which method further comprises at least a first data decompression, which is performed after the data is received, the data compression and decompression being performed by use of a specific hash table, by which data compression a symbol for each data segment is generated, which symbols are transmitted to the receiver, in which receiver the symbols are decompressed by use of the specific hash table, whereby characterized in that the specific hash table is performed as a hash table array, which hash table array generates symbols comprising at least a hash count and a parity check, in which hash table array the parity check comprises generating of a data string, which data string is compared with a parity stored in the hash table, where if both parities are the same, the data model returns the count in the hash table element for transmission, and where, if a zero count is returned indicating that the data string is not valid in the hash table, no transmission is performed.

2. The method according to claim 1, whereby characterized in that the method concerns a specific hash function, comprising a data array in which each element containing two entries, which method further concerns a parity check function, in which parity check function, the string is given to a One-at-a-Time hash function, which function transfers the string of data characters to an integer number within an interval, which interval contains a first tablesize, which first tablesize denotes the total number of elements in the hash table.

3. The method according to claim 2, whereby the required memory and the complexity is reduced by using a context model, which context model for the first comprises a data model and for the second functions for estimating statistics, which statistics comprises at least a total, a left, and a right count, which counts are generated on the fly, which data model at least comprises the symbol counts.

4. The method according to claim 3, whereby each single symbol counts refers to a single node in a data three.

5. The method according to claim 4, whereby the data model is parameterized by just one parameter, which parameter is the size of the hash table, where each count of the hash table refers to an arbitrarily long string, whereby the model works for each statistical context model order without any changes in the implementation.

6. The method according to claim 5, whereby a statistical model consists of an array of elements, where each of the array elements contains the count and the parity, which numbers are calculated by a more complex statistical context model for adaptive modeling, where the data model consists of a hash table with collision resolving techniques, where training of the context model is performed by the text file, from which text file the training data shall be extracted for compression, while the more complex hash table with linked elements is filled with statistical data.

7. The method according to claim 6, whereby the compression is finished, the amount of statistical data in the data model is reduced, where each linked list is searched for the maximum statistical item count, and the maximum counts are written into the first elements of the linked list, where the remaining elements of the linked lists are deleted.

8. The method according to claim 7, whereby the appending strings to the counts of the table are recalled for to calculate the parities, where a parity of one table element is calculated by a logical exclusive-OR operation of the single symbols of one string, for obtaining a low complexity data model, which data model is an array of elements, where each element containing a count and a parity.

9. The method according to claim 8, whereby a low-complexity data model consists of a subspace of the original data model, which contains the context nodes that are of statistical importance.

10. The method according to claim 9, whereby an indicator to assess the statistical quality of the retained nodes are the frequency each node is accessed during the compression.

11. The method according to claim 9, whereby lossless text compression is performed by algorithms comprising a statistical context model, which model comprises an arithmetic coder and a context model library, which context model uses a data structure with linked lists for resolving collisions, where each node of a data tree is represented by a list item, which contains a pointer to a key and selected node statistics comprising a symbol and a total count, where a bit-mask is employed to indicate present successors of the node.

* * * * *